United States Patent
Umotoy et al.

(10) Patent No.: US 6,364,954 B2
(45) Date of Patent: *Apr. 2, 2002

(54) HIGH TEMPERATURE CHEMICAL VAPOR DEPOSITION CHAMBER

(75) Inventors: Salvador P. Umotoy, Antioch; Steve H. Chiao, Fremont; Anh N. Nguyen, Milpitas; Be V. Vo, Sunnyvale; Joel Huston; James J. Chen, both of San Jose; Lawrence Chung-Lai Lei, Milpitas, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/211,998

(22) Filed: Dec. 14, 1998

(51) Int. Cl.[7] ............................................... C23C 16/00
(52) U.S. Cl. ..................... 118/715; 118/725; 118/728; 118/723 E
(58) Field of Search ................................ 118/715, 725, 118/723 E, 728

(56) References Cited

U.S. PATENT DOCUMENTS

| | | | |
|---|---|---|---|
| 5,271,963 A | 12/1993 | Eichman et al. | 427/248.1 |
| 5,279,857 A | 1/1994 | Eichman et al. | 427/255 |
| 5,308,655 A | 5/1994 | Eichman et al. | 427/248.1 |
| 5,348,587 A | 9/1994 | Eichman et al. | 118/723 |
| 5,356,476 A | 10/1994 | Foster et al. | 118/725 |

(List continued on next page.)

FOREIGN PATENT DOCUMENTS

| | | | |
|---|---|---|---|
| EP | 0 687 749 A1 | 12/1995 | ........... C23C/16/44 |
| EP | 0 714 998 A2 | 6/1996 | ........... C23C/16/44 |
| EP | 0 855 453 A1 | 7/1998 | ........... C23C/16/44 |
| JP | 03211279 | 9/1991 | ........... C23C/16/44 |
| JP | 03236221 | 10/1991 | ......... H01L/21/205 |
| JP | 4-136175 | * 5/1992 | |
| JP | 5-29225 | * 2/1993 | |

OTHER PUBLICATIONS

Chemical Vapor Deposition of Tin for ULSI Applications:, M. Eizenberg, Mat. Res. Soc. Symp. Proc. vol. 427, 1996 Materials Research Society.

*Primary Examiner*—Jeffrie R. Lund
(74) *Attorney, Agent, or Firm*—Moser, Patterson & Sheridan, LLP.

(57) ABSTRACT

An apparatus for wafer processing, which comprises a chamber body and a heated liner which are thermally isolated from each other by isolating pins. During wafer processing, e.g., deposition of titanium nitride film by thermal reaction between titanium tetrachloride and ammonia, a wafer substrate is heated to a reaction temperature in the range of 600–700° C. by a heated support pedestal. The chamber liner and the interior chamber walls are maintained at a temperature between 150–250° C. to prevent deposition of undesirable by-products inside the chamber. This facilitates the chamber cleaning procedure, which can be performed using an in-situ chlorine-based process. The excellent thermal isolation between the heated liner and the chamber body allows the chamber exterior to be maintained at a safe operating temperature of 60–65° C. A heated exhaust assembly is also used in conjunction with the process chamber to remove exhaust gases and reaction by-products. External heaters are used to maintain the exhaust assembly at a temperature of about 150–200° C. to minimize undesirable deposits on the interior surfaces of the exhaust assembly.

16 Claims, 10 Drawing Sheets

U.S. PATENT DOCUMENTS

| | | | |
|---|---|---|---|
| 5,370,739 A | 12/1994 | Foster et al. | 118/725 |
| 5,416,045 A | 5/1995 | Kaufman et al. | 437/174 |
| 5,451,258 A | 9/1995 | Hillman et al. | 118/715 |
| 5,558,717 A * | 9/1996 | Zhao et al. | 118/715 |
| 5,567,243 A | 10/1996 | Foster et al. | 118/730 |
| 5,567,483 A | 10/1996 | Foster et al. | 427/535 |
| 5,593,511 A | 1/1997 | Foster et al. | 148/238 |
| 5,610,106 A | 3/1997 | Foster et al. | 437/245 |
| 5,665,640 A | 9/1997 | Foster et al. | 438/680 |
| 5,788,799 A | 8/1998 | Steger et al. | 156/345 |
| 5,812,403 A | 9/1998 | Fong et al. | 364/468.28 |
| 5,846,332 A * | 12/1998 | Zhao et al. | 118/728 |
| 5,855,675 A * | 1/1999 | Doering et al. | 118/719 |
| 5,904,757 A * | 5/1999 | Hayashi et al. | 96/416 |
| 6,055,927 A * | 5/2000 | Shang et al. | 118/723 ME |
| 6,056,823 A * | 5/2000 | Sajoto et al. | 118/715 |
| 6,079,356 A * | 6/2000 | Umotoy et al. | 118/723 E |
| 6,117,244 A * | 9/2000 | Bang et al. | 118/715 |
| 6,129,808 A * | 10/2000 | Wicker et al. | 156/345 |
| 6,159,298 A * | 12/2000 | Saito | 118/715 |
| 6,206,971 B1 * | 3/2001 | Umotoy et al. | 118/715 |
| 2001/0004879 A1 * | 6/2001 | Umotoy et al. | 118/715 |

\* cited by examiner

HIGH TEMPERATURE CHEMICAL VAPOR DEPOSITION CHAMBER

BACKGROUND OF THE DISCLOSURE

1. Field of the Invention

The present invention relates to semiconductor wafer processing systems and, more particularly, to a high temperature chemical vapor deposition (CVD) chamber with a heated inside liner, and a temperature-controlled outer chamber body.

2. Description of the Background Art

Titanium nitride (TiN) film has found wide applications in ultra large-scale integrated circuits (ULSI) as a diffusion barrier and as an adhesion layer for tungsten contacts. Low temperature reactive sputtering of Ti in the presence of nitrogen has been used in the past to deposit TiN films upon semiconductor wafers. However, as device geometries become increasingly smaller, the resulting step coverage from a sputtered TiN film is no longer adequate. Therefore, chemical vapor deposition (CVD) techniques have become the methods of choice in ULSI applications. For example, TiN film from a titanium tetrachloride based CVD process can be used as a high aspect ratio contact barrier, a capacitor top electrode or in plug fill processes below 0.18 $\mu$m.

Both cold wall and hot wall low pressure chemical vapor deposition (LPCVD) processes have been used for depositing TiN films using a reaction between titanium tetrachloride (TiCl$_4$) and ammonia (NH$_3$). A cold wall reactor contains a wafer that is heated to a temperature above the reaction temperature of the process gases, e.g., over 650° C., by a halogen lamp that is located external to the chamber. However, since the chamber walls are cold (unheated), process by-products such as adduct ammonia salts will detrimentally form on the interior surfaces of the cold chamber walls or other cold surfaces. During thermal cycling of the chamber, these deposits may flake and fall on a wafer causing contamination and reducing wafer yield. Since these reaction by-products cannot be removed by in-situ chamber cleaning processes, frequent chamber disassembly and cleaning is required. This necessitates the opening of the chamber to the atmosphere, and results in considerable down time for the chamber.

Alternatively, quartz hot wall reactors have been used to form high quality TiN films. The heated walls of these reactors help reduce accumulation of undesirable deposits, such as adduct ammonia salts, on the interior chamber walls. However, hot wall chambers can be dangerous to operate because of the high temperature of the walls, e.g., 150–200° C. Furthermore, it is difficult to achieve uniform heating of the chamber walls and other interior surfaces such that no undesirable deposits form.

One possible solution is the use of a chamber liner, such as that disclosed in U.S. Pat. No. 5,348,587, issued on Sep. 20, 1994, to Eichman et al., entitled "Apparatus for Elimination of Low Temperature Ammonia Salts in TiCl$_4$ NH$_3$ CVD Reaction," which is a continuation of U.S. Pat. No. 5,271,963, issued on Dec. 21, 1993. Both patents are herein incorporated by reference. Eichman et al. discloses an inside liner which is partly heated by lamps external to the chamber, and partly heated by a secondary plasma. This heated liner is located within a cold reactor wall enclosure. The heated liner lies against the inner surface of the cold reactor wall, and, as such, is only partially insulated from the reactor wall. Not only does this contact promote excessive thermal conduction to the reactor wall resulting in the chamber wall becoming dangerously hot, but additional heating of the liner will be needed to compensate for the heat lost to the wall.

Therefore, a need exists in the art for a CVD chamber having a heated liner which substantially defines a chamber cavity and is thermally isolated from the external chamber body.

SUMMARY OF THE INVENTION

The disadvantages of the prior art are overcome by an apparatus for processing a wafer having a chamber body that encloses a chamber liner, where the liner is maintains a spaced apart distance from the chamber body such that the liner is maintained at a higher temperature than the chamber body. As such, the liner can be maintained at a temperature that reduces the amount of deposition on the liner while maintaining a safe temperature for the chamber body.

More specifically, the present invention relates to a process chamber system for high temperature film deposition, e.g., using a reaction between titanium tetrachloride (TiCl$_4$) and ammonia (NH$_3$) to deposit titanium nitride (TiN). The system comprises a process chamber and an exhaust assembly. The process chamber has an inside liner which is maintained at a temperature of approximately 150–250° C., while the chamber body is maintained at a temperature of approximately 60–65° C. or below. The liner can either be heated directly by a resistive heater embedded in the liner, or indirectly by a heated wafer support pedestal. The liner, which is substantially cylindrical, is enclosed within the bucket-shaped chamber body having a cylindrical wall and a base. Isolating pins are located between the bottom of the liner and the inside surface of the chamber base such that a spacing is maintained between the liner and the chamber body, i.e., the liner only contacts the chamber body through the isolating pins. Excellent thermal isolation is achieved between the liner and the chamber body because of the low thermal conductivity resulting from the small contact area between the isolating pins and the liner.

The process chamber further comprises a heated wafer support pedestal for supporting and heating a semiconductor wafer and a showerhead for separately introducing TiCl$_4$ and NH$_3$ into the process chamber into a space above the wafer. The wafer is maintained at a temperature of approximately 600–700° C. such that a thermal reaction occurs at the surface of the wafer between TiCl$_4$ and NH$_3$, resulting in the formation of a TiN film upon the wafer.

The exhaust assembly is connected to the process chamber to allow for continuous pumping of gases away from the process chamber. In one embodiment, a substantial portion of the exhaust assembly is maintained at approximately 150° C.–200° C. by the use of several heaters disposed on the outside walls of the exhaust assembly. Such heating reduces reaction by-product accumulation within the exhaust assembly.

BRIEF DESCRIPTION OF THE DRAWINGS

The teachings of the present invention can be readily understood by considering the following detailed description in conjunction with the accompanying drawings, in which:

FIG. 2a is a cross-sectional view of the process chamber, showing details of various components inside the process chamber of FIG. 1;

FIG. 2b shows an enlarged cross-sectional view around the area of the inside liner, the isolating pin and the chamber body of FIG. 2a;

FIG. 3b shows a cross-sectional view of the dual-gas faceplate of the showerhead assembly of FIG. 3a;

FIG. 4b is a cross-sectional view showing the channel inside the cooling plate of FIG. 4a;

FIG. 4c is a side view of the cooling plate of FIG. 4a;

FIG. 7b is a cross-sectional view illustrating the RF connections to the chamber of FIG. 7a.

To facilitate understanding, identical reference numerals have been used, where possible, to designate identical elements that are common to the figures.

DETAILED DESCRIPTION OF THE INVENTION

Figure 1:
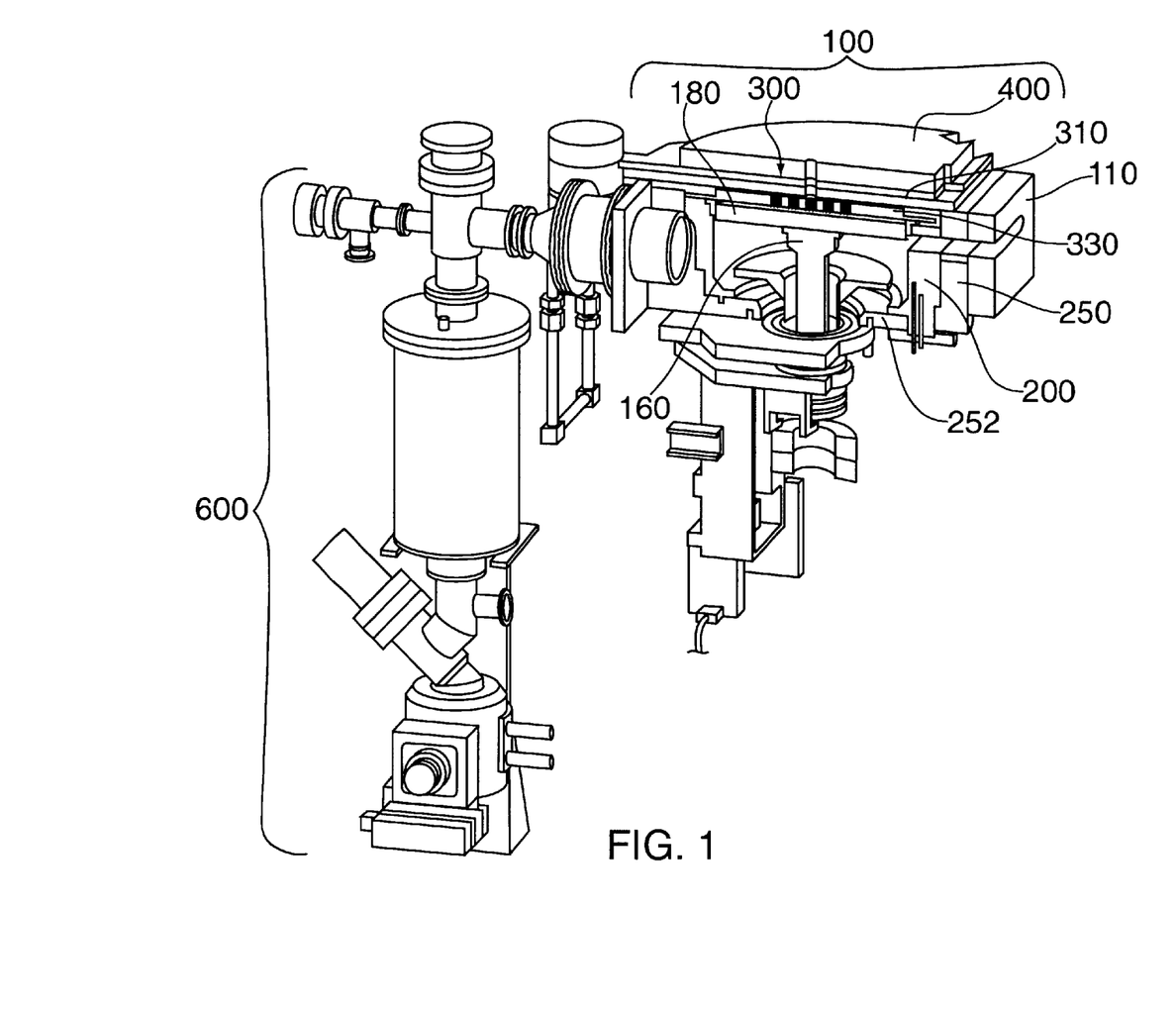
FIG. 1 is a partial cross-sectional perspective view of the high temperature CVD chamber system of the present invention, showing a process chamber and an exhaust assembly.

FIG. 1 shows a partial cross-sectional perspective view of a high temperature chemical vapor deposition (HT CVD) system, including a process chamber 100 and an exhaust assembly 600. A chamber mounting plate 110 is provided for mounting this process chamber 100 onto a wafer transfer chamber (not shown) which interfaces the process chamber 100 to the rest of a complete wafer processing system, such as a Centura 5200 system (not shown) manufactured by Applied Materials, Inc. of Santa Clara, Calif. Cross-sectional views illustrating various components in the process chamber 100 are shown in FIGS. 2–5. To best understand the process chamber 100 of the present invention and its operation, the reader should simultaneously refer to all these figures.

The process chamber 100 of the present invention performs, for example, high temperature deposition of titanium nitride upon a semiconductor wafer using a $TiCl_4$+ $NH_3$ chemistry. Since the thermal decomposition of $TiCl_4$ and $NH_3$ occurs at high temperature, the wafer should preferably be maintained at a temperature range of 600–700° C. to facilitate deposition upon the wafer.

The process chamber 100 comprises a chamber body 250, a liner 200, a pedestal assembly 160 and a showerhead assembly 300. The pedestal assembly 160 contains a pedestal 180 that supports the wafer in the chamber 100. The dual-gas showerhead assembly 300 is positioned in a parallel, spaced apart relation with respect to the pedestal 180 such that the wafer support surface of the pedestal 180 and a faceplate 330 of the showerhead assembly 300 define a reaction zone. To achieve deposition, the wafer is heated by a heated pedestal 180 while the showerhead assembly 300 introduces the two reactant gases ($TiCl_4$ and $NH_3$) into the process chamber 100 such that reaction occurs only above the wafer, resulting in TiN deposition onto the wafer. In order to minimize unwanted TiN deposition on the inside surface of the chamber, the interior wall of the chamber, i.e., the chamber liner 200, is maintained at a temperature between 150° C. to 250° C. An improved bottom purge arrangement is also provided to reduce undesirable adduct reaction by-products which may form on cold areas of the chamber. The heated exhaust assembly 600 also prevents the formation of powder deposits on the interior walls of the exhaust assembly 600. This powder deposit is a reaction by-product between $TiCl_4$ and $NH_3$ which forms at a temperature below 150° C. At a temperature above 150° C. but below 600° C., minimal amounts of TiN is deposited on interior chamber components. The TiN film that is inadvertently deposited on chamber components can readily be removed by an in-situ thermal chlorine cleaning process performed within chamber 100 of the present invention.

Chamber Body and Heated Inside Liner

Figures 2A, 2B:
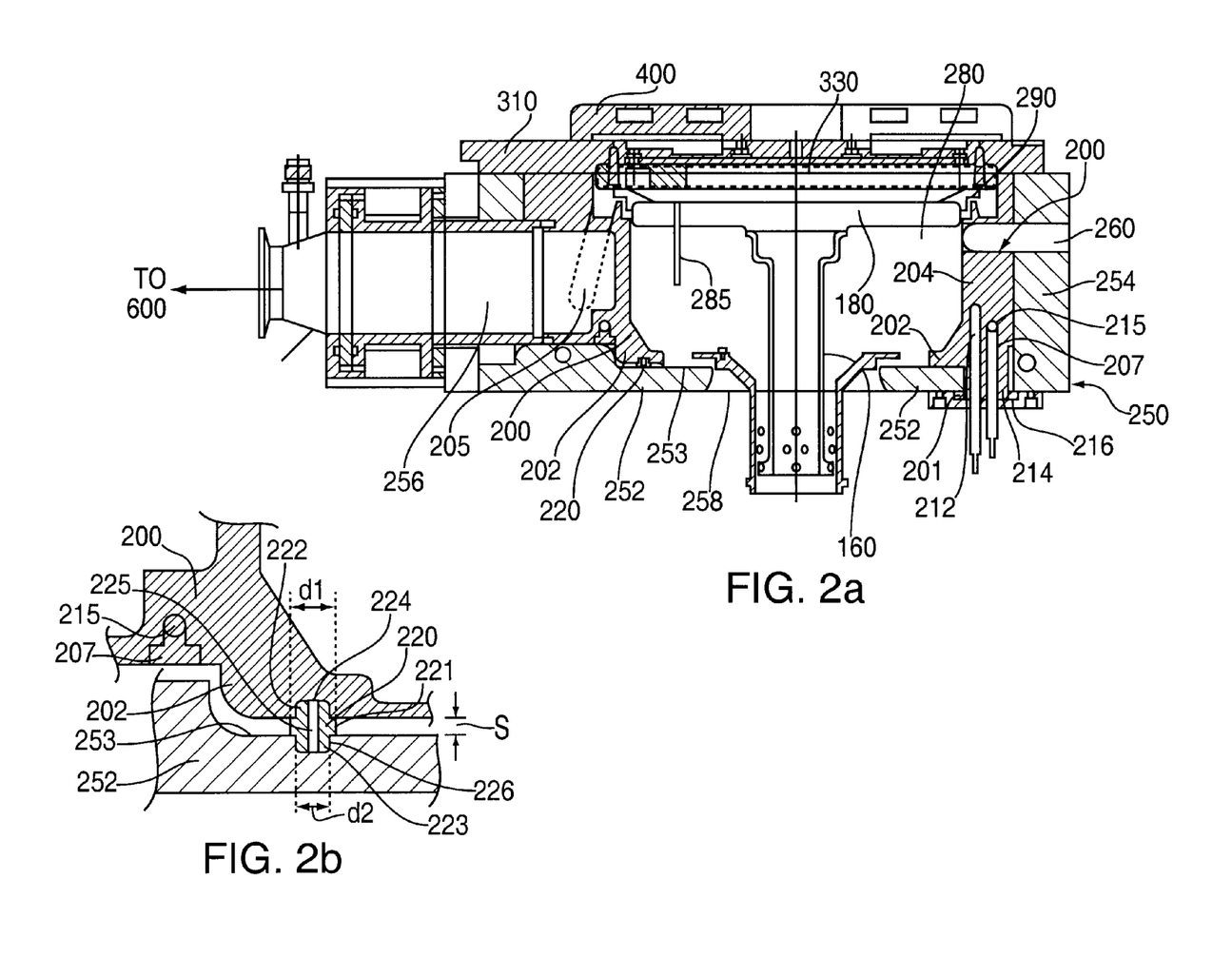

As shown in FIG. 2a, the chamber body 250 is substantially bucket-shaped, with a cylindrical side 254 and a base 252. There is an opening 256 at one portion of the cylindrical side 254, which is connected to the exhaust assembly 600 for the removal of process and product gases. The chamber base 252 has a centrally-located opening 258, which is provided to accommodate a pedestal assembly 160, as well as a gas purging arrangement to be described below. An inside liner 200, which is substantially cylindrical, is located on the inside, but spaced apart from the chamber body 250. The chamber body 250, which substantially encloses this inside liner 200, is made of nickel-plated aluminum. In this particular application, nickel plating is needed to protect the aluminum components from corrosion by chlorine gas, which is used in an in-situ chamber cleaning process to be described below. Of course, for other applications with different cleaning processes, alternative metal-plating may be used as long as it is compatible with the chemical species used in the reaction or cleaning processes.

To avoid an exterior temperature of the chamber body 250 that may harm a user/operator, the chamber body temperature is maintained at approximately 60° C.–65° C. or less by thermally isolating the chamber body 250 from the inside heated liner 200. The inside liner 200, which is also made of nickel-plated aluminum, has an embedded resistive heater 215 for establishing a fixed liner temperature. A thermal conductive paste is applied to the resistive heater 215 and enclosed within a cover plate 207 which is welded to the liner 200 to ensure good thermal conductivity between the heater 215 and the liner 200. An AC voltage is coupled to the heater 215 using AC connectors inside a feedthrough portion 214 of the liner 200. This heater 215 can optionally be used to dynamically control the temperature of the liner 200. For example, the heater 215 may be used to maintain the liner temperature at approximately 150 to 250° C. to avoid the formation of adduct ammonia salt or other process by-products on the interior surface of liner 200. To facilitate dynamic thermal control of the liner 200, a Type K thermocouple 212 is removably inserted in the liner 200 approximately half the distance along its cylindrical wall 204. Thus, the liner temperature can be measured at approximately half way from the bottom 202 of the liner 200. Connectors (not shown) for the thermocouple 212 and the resistive heater 215 are located inside the feedthrough portion 214 of the liner 200. A clamping plate 216 seats an O-ring 201 against the chamber base 252 and the feedthrough portion 214 to seal the interior of the chamber 100 from the outside atmosphere.

In practice, independent heating by the resistive heater 215 is not always necessary to achieve an appropriate liner temperature since the operation of the heated pedestal 180 (see FIG. 2a) alone is generally sufficient to maintain the temperature of the liner 200 within the desired range of 150–250° C. Of course, this heater 215 may be used, alone or in conjunction with the heated pedestal 180, for other processes with different temperature requirements.

The inside liner 200 and the chamber body 250 are substantially isolated from each other by means of three dowel pins 220, one of which is shown in the cross-sectional view in FIG. 2a. These isolating pins 220 are located between the bottom 202 of the inside liner 200 and the inside surface 253 of the chamber base 252. The area around the inside liner 200, dowel pin 220 and the chamber base 252 is shown in an enlarged cross-sectional view in FIG. 2b. The three pins 220 are arranged to lie equidistant from each other on the circumference of a circle, subtending angles of 120 degrees at the center of the circle. Each dowel pin 220 has a central portion 221 having a diameter $d_1$ and two smaller ends 222 and 223, each having a diameter $d_2$, where $d_2$ is less than $d_1$. As is typical in vacuum applications, a drilled-through hole 225 is provided along the longitudinal axis of the pin 220 to allow for pump-out of any trapped gases. The pins 220 are press-fit into corresponding receiving holes 224 in the bottom 202 of the liner 200, such that the liner 200 rests against one side of the larger central portion 221 of each pin 220. There are also three corresponding holes 226 on the inside surface 253 of the chamber base 252 to accommodate these pins 220. One of these holes 226 is round, and the other two are slotted (not shown) to provide for additional assembly tolerance.

When the liner 200, with the dowel pins 220 in place, is set to rest in these holes 226 inside the chamber base 252, the pins 220 serve to maintain a proper spacing (s) between the liner 200 and the chamber base 252. This spacing (s) corresponds to the thickness of the larger central portion 221 of the pin 220, which is about 0.135" (3.4 mm). Four ¼–20 nickel screws (not shown), which also lie on the circumference of the same diameter circle as the dowel pins 220, are used to secure the liner 200 in place by screwing into corresponding tapped holes (not shown) on the inside surface 253 of the chamber base 252. The small contact areas of the nickel pins 220 and screws ensure very good thermal isolation between the heated liner 200 and the chamber body 250, and allows the chamber body 250 to be kept at around 65° C. while maintaining the heated liner at 150–250° C.

These dowel pins 220 can be made of a variety of materials that can withstand high temperatures and have a relatively high thermal resistivity (low thermal conductivity), such as stainless steel or nickel. The choice of material depends on the specific processing applications. For example, nickel (200 or 201 grade), is the preferred material because of its chemical resistance to chlorine and high thermal resistance. It is understood that the dimensions and specific layouts for the various components are for illustrative purpose only. For example, the liner 200 could be spaced from the body 250 by intermittently spaced ribs formed in the bottom 252 of chamber body 250, a continuous annular ridge formed in the bottom 252 of the chamber body 250, a spacer ring positioned on the bottom 252 of the chamber body 250 and the like. As such, the present invention encompasses many other chamber/liner/spacer combinations that facilitate thermal isolation between the liner 200 and the chamber body 250. Such isolation enables separate temperature control of these components.

Lid/Gas Box and Dual-gas Faceplate

Figure 3A:
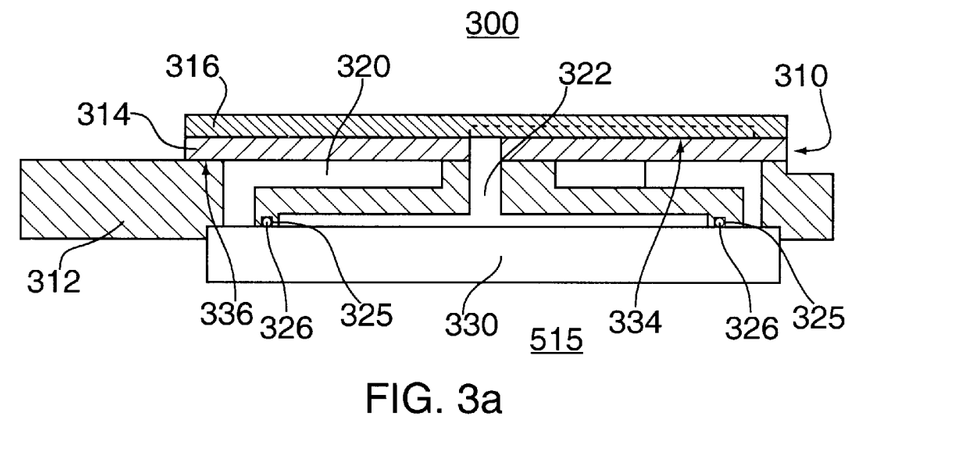
FIG. 3a shows a cross-sectional view of the showerhead assembly.

FIG. 3a shows a cross-sectional view of the dual-gas showerhead assembly 300, comprising a nickel-plated aluminum lid/gas box (manifold assembly 310) and a faceplate 330. The showerhead assembly 300 provides a dual-gas separate entry for $TiCl_4$ and $NH_3$ into the process chamber 100 without premixing of the gases. The gas manifold assembly 310 also serves as the lid of the chamber 100. The faceplate 330 is described in a commonly-assigned patent application by Umotoy et al. entitled "Dual Gas Faceplate for a Showerhead in a Semiconductor Wafer Processing System," Ser. No. 09/098969, filed Jun. 16, 1998; which is herein incorporated by reference. The showerhead assembly 300 allows two gases, for example, $NH_3$ and $TiCl_4$, to be separately introduced into the reaction region, or processing zone 515. The processing zone 515 is roughly defined by the space between the bottom 332 of the faceplate 330 and the heated pedestal 180, which is the top portion of a pedestal assembly 160 to be described below. (See FIG. 5a.) In order to avoid the formation of undesirable deposits inside the showerhead assembly 300, separate flow paths or passageways are established through different channels 320 or chambers 322 inside the showerhead assembly 300. These channels 320 and chambers 322 prevent mixing of the two gases prior to reaching the process zone 515. Briefly, the gas manifold or lid 310 comprises three plates—bottom 312, middle 314 and top 316, which have been fused together by vacuum brazing their mating surfaces 334 and 336 using a silicon-rich aluminum film, clamping the entire assembly and placing the assembly in a furnace at a temperature of approximately 550° C. to form a unitary manifold assembly 310. As such, no O-rings are necessary to provide isolation between the process gases as they flow through the manifold assembly 310. These plates 312, 314 and 316, contain a combination of channels 320 and chambers 322, such that when the faceplate 330 is bolted to the manifold assembly 310, the myriad of channels 320 and chambers 322 provide proper passageways, or flow paths, for introducing two gases separately from their supply sources (not shown) outside the chamber 100 into the process zone 515 without pre-mixing of the gases.

Figure 3B:
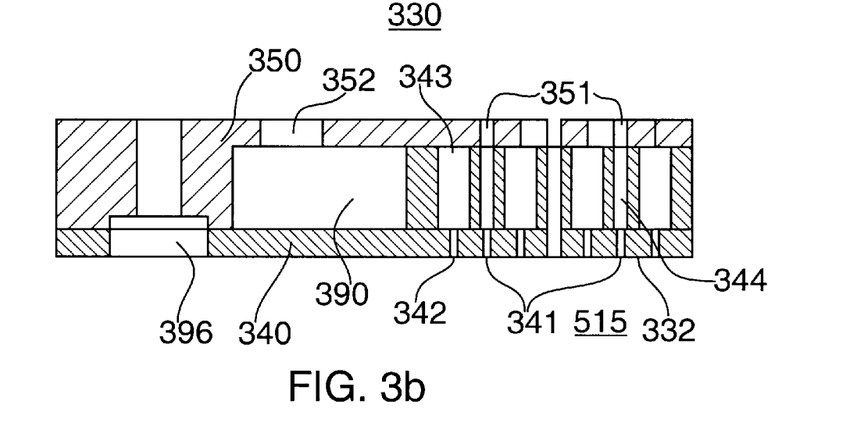

The faceplate 330 further comprises a lower gas distribution plate 340 and a upper gas distribution plate 350, as shown in FIG. 3b. The specific arrangement of channels 343 and holes (351, 352, 341, 342 and 344) that together define distinct passageways or flow paths for the two process gases are described in detail in the above-referenced patent application, Ser. No. 09/098969. Suffice to say that when the two plates, 340 and 350, are fused together using the same technique as previously described for the gas manifold plates 312, 314 and 316, the resulting unitary faceplate 330 provides separate passageways, or flow paths, for uniformly introducing two gases into the processing zone 515 without pre-mixing of the gases.

For example, there are two sets of holes, 341 and 342, in the lower plate 340, one for each gas. As shown in FIG. 3b, one set of holes 341 aligns with holes 351 in the upper plate to form one flow path (from 351, via 344 to 341) for one gas, e.g., $TiCl_4$. The other set of holes 342 are connected to channels 343 within the lower plate 340. These channels 343 are in turn connected to a circumferential plenum 390, which is formed between the upper and lower plates, 350 and 340, when they are fused together. The plenum 390 is further connected to another hole 352 in the upper plate 350, which provides an inlet for a second gas, e.d., $NH_3$. This configuration allows the first gas to pass through the first passageway (e.g., from 351, via 344 to 341) and the second gas to pass through the second passageway (e.g., from 352, via 390 to 343 and 342) within the faceplate 330 without mixing until the gases enter the process zone 515 after exiting from these holes 341 and 342 at the bottom 332 of the faceplate 330. It should be noted that the choice of hole size for each gas and hole distribution are functions of process conditions. For example, the hole size will vary depending upon gas flow rate, gas pressure, gas type, chamber pressure and the faceplate 330 such that gas flow rates through the holes are correlated with the locations of the holes in the faceplate 330.

The showerhead assembly 300 is formed by affixing the faceplate 330 directly to the bottom of the gas distribution manifold 310 using a plurality of bolts (not shown) through the mounting holes (hole 396 is shown in FIG. 3b) in the faceplate 330. An O-ring groove 325 (see FIG. 3a) is provided in the gas manifold 310 to accommodate an O-ring 326 which is used to provide sealing between the gas manifold 310 and the faceplate 330. Different types of O-ring materials, such as Viton, may be used, as long the material is compatible with the operating temperature and chemically resistant to the gases used in the process. Both the faceplate 330 and the gas distribution manifold 310 are made of nickel-plated aluminum or some other thermally conductive and chlorine compatible materials such as nickel. Of course, other material choices are possible as long as they provide the thermal conductivity and/or chemical compatibility which are necessary for the specific process.

The showerhead assembly 300 can be coupled to a cold plate assembly 400 or other cooling apparatus that will maintain the entire lid/gas box 310 at a uniform and constant temperature. During wafer processing, the showerhead assembly 300 is heated by the heated pedestal 180 through thermal radiation in the reaction zone 515. Therefore, to avert deposition of TiN or by-products of the TiN deposition process upon and/or within the showerhead, a cold plate assembly 400 is necessary to maintain the faceplate temperature within a range of 150–250° C. The cold plate assembly 400 serves a dual-purpose of preventing the showerhead assembly 300 from temperature drift, as well as keeping the areas around the O-ring seal to within specification for proper sealing.

Cold Plate Assembly

Figure 4A:
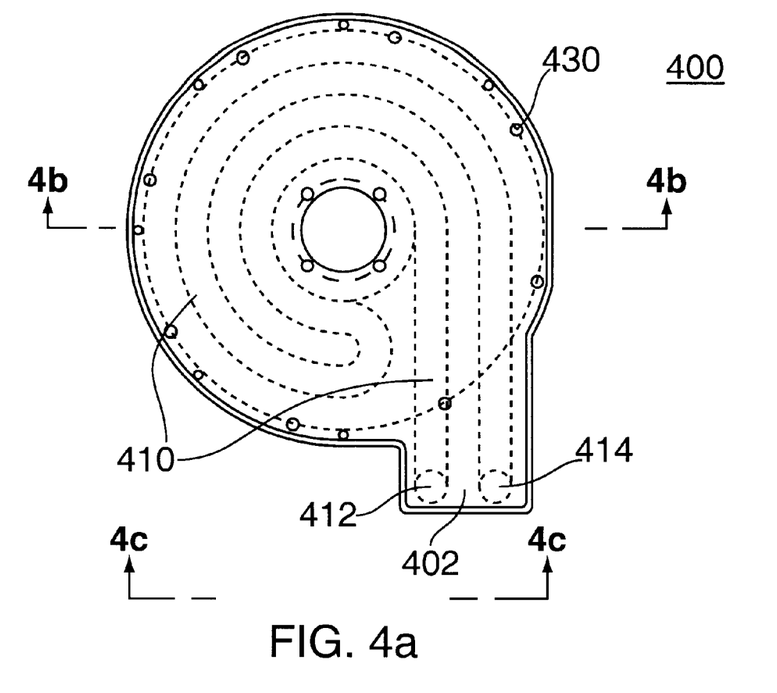
FIG. 4a is a top view of the cooling plate.
Figure 4B:
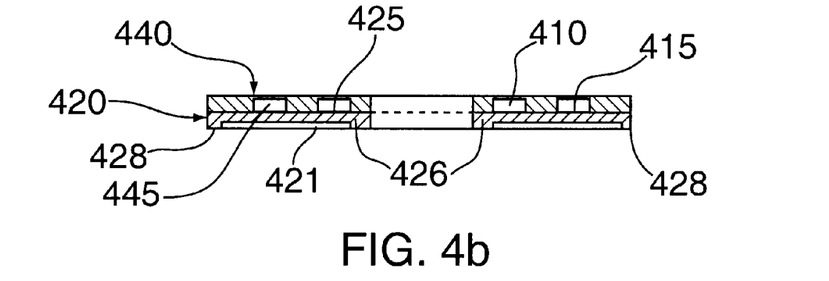
Figure 4C:
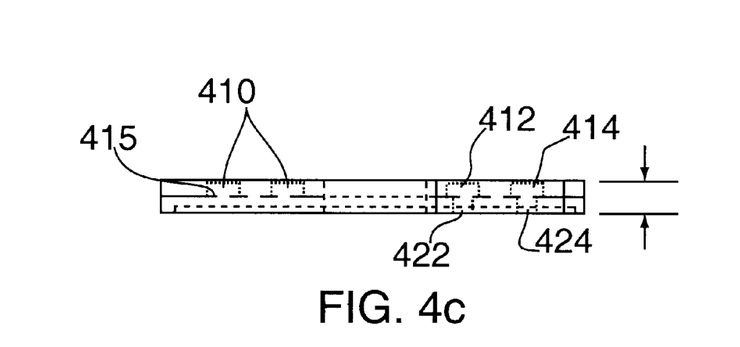

A detachable cold plate assembly 400 is designed to maintain temperature of the lid/gas box 310 to prevent it from temperature drift. FIG. 4a is a schematic illustration of the top view of the cold plate assembly 400. This cold plate assembly 400 is substantially annular in shape, except for a rectangular protruded portion 402. FIG. 4b shows a cross-sectional view of the cold plate assembly 400, comprising a top plate 440 and a bottom plate 420, which are brazed together and then nickel-plated as an assembly. The top plate 440 has a coil-shaped channel 410 passing through the plate 440 for circulating coolant, as illustrated in FIG. 4a. The two ends, 412 and 414, of the coil-shaped channel 410 are located at the rectangular protruded portion 402, and serve as the inlet and outlet for the coolant. The channel 410 has a rectangular cross-section and is open on its bottom side 415. This is illustrated in the cross-sectional view shown in FIG. 4b and the side view shown in FIG. 4c. The top surface 425 of the bottom plate 420, when brazed together with the top plate 440, defines a closed channel 445 through which a coolant can circulate. The bottom plate 420 has two apertures 422 and 424, close to the end of the rectangular protruded portion 402. These apertures 422 and 424 are aligned respectively with the two ends 412 and 414 of the top plate channel 410 to provide for coolant inlet and outlet. The coolant, typically water, is connected in series with the coolant for the chamber 100.

The cold plate assembly 400 is attached onto the top of the lid/gas box (310 in FIG. 3a) using screws at locations 430 around the circumference of the cold plate assembly 400. Note that one annular portion 421 of the bottom plate 420 is recessed such that only an inner 426 and an outer 428 portion of the bottom plate 420 actually come into physical contact with the chamber lid 310. The cooling plate assembly 400, lid/gas box 310 and the faceplate 330 are sometimes collectively referred to as a lid assembly. With an inlet water temperature of about 45–55° C., the lid/gas box 310 can readily be maintained within a temperature range of 60–65° C.

As a detachable component, this cold plate assembly 400 is a cost-effective design feature which allows for ease of maintenance as well as design and process flexibility. For example, different temperature control scenarios for the faceplate 330 may be achieved by a suitable interchange with a different cooling (or heating) plate that provide more or less heating or cooling. To most effectively process a wafer or wafers, the cold plate assembly 400 that is best suited for a particular process can be easily installed onto the chamber lid.

Pedestal Assembly

Figure 5A:
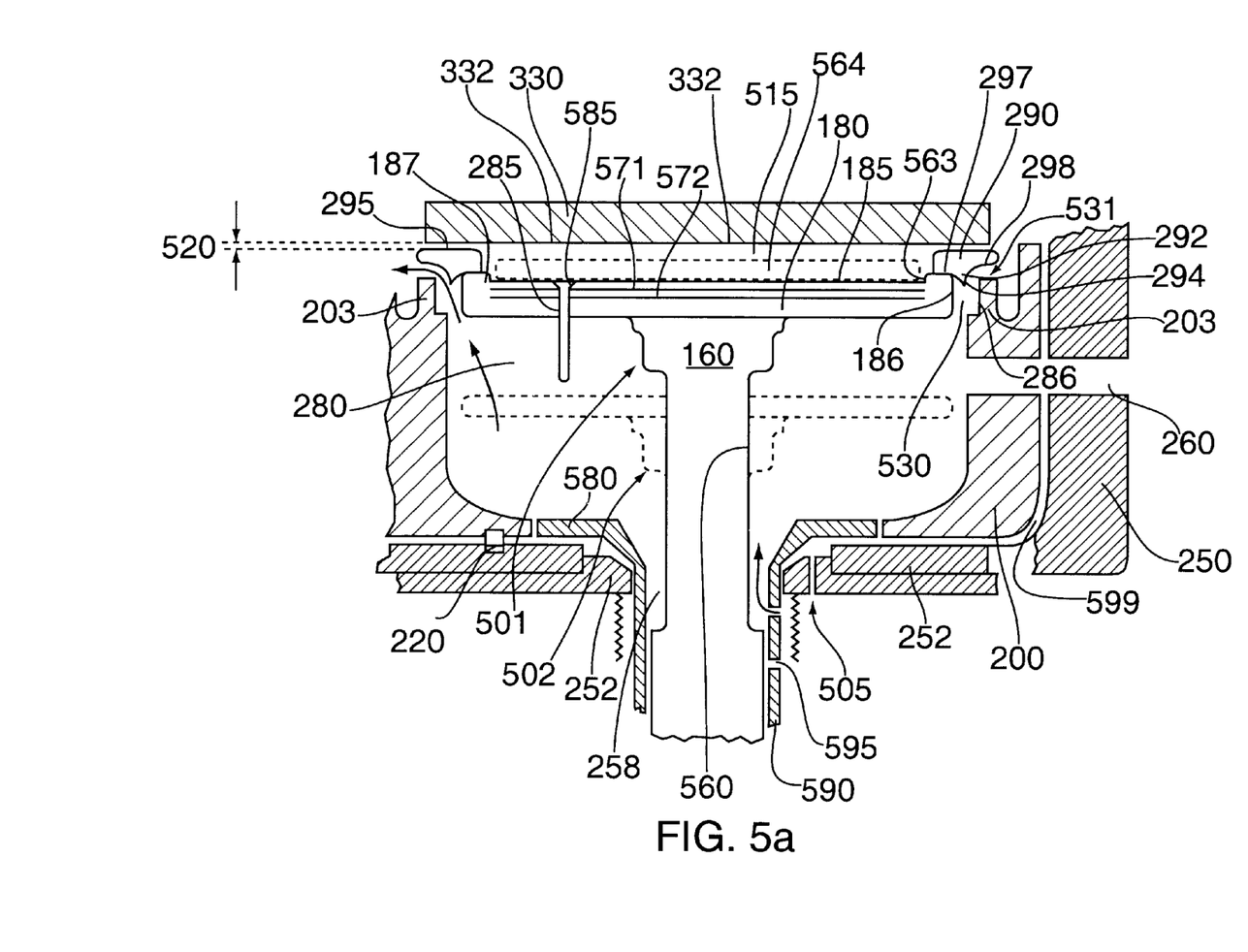
FIG. 5a is a cross-sectional view of the process chamber showing the bottom purge arrangement.

FIG. 5a illustrates a pedestal assembly 160 in a cross-sectional view within the process chamber 100. The pedestal assembly 160 comprises a flat circular portion 180 at the top, sometimes referred to as a susceptor or pedestal; and a bottom cylindrical shaft-like portion 560 which extends downwards through the centrally-located opening 258 at the bottom 252 of the chamber body 250. The upper surface 185 of the pedestal 180 has a wafer pocket 563 to support a wafer 564 (shown in phantom in FIG. 5a), and four clearance holes to accommodate wafer lift pins 285. These wafer lift pins 285 are made of ceramic, and are used for wafer-handling and transport. They are slidably mounted within bores in the pedestal 180 and can be lifted above the pedestal's upper surface 185 by engaging a wafer lift ring 580, in order to raise and lower the wafer with respect to the support surface 185 of the pedestal 180. These lift pins 285 are kept from falling out from the pedestal 180 by conical heads 585 located on their upper ends. The current pedestal assembly 160 and chamber design can accommodate wafer diameters of 125 mm, 150 mm and 200 mm, respectively. Those skilled in the art can perform proper design scale-up to encompass applications to larger wafer diameters such as 300 mm as well.

The pedestal 180, preferably made of a ceramic material such as aluminum nitride (AlN), is further equipped with two embedded electrodes 571 and 572. In general, these electrodes 571 and 572, made of different types of conducting materials, can be of various thicknesses and shapes. In the present invention, one of these electrodes is a radio-frequency (RF) grid 571 for performing plasma clean and other plasma processes such as plasma annealing of the wafer. The mesh-type grid 571, made of molybdenum, is located slightly below the pedestal's top surface 185. Slightly below the RF electrode is an alternating current (AC) grid 572 for heating purpose. The pedestal 180 currently in use is made of a dark gray, high resistivity AlN of 99.9% purity. Of course, other similar heaters may also be used, depending on the specific process requirements. This heated pedestal 180 allows the wafer temperature to be controlled within a range of approximately 600–800° C. Although TiN film deposition can also be performed between 200–600° C., the resulting TiN film tends to have an undesirably high chlorine content. Therefore, the wafer temperature is preferably maintained within a range of 600–700° C. for optimal deposition results. During wafer processing, there is also a center-to-edge temperature difference in the pedestal 180 of about 10° C., with the edge 186 being cooler because of a purge gas flow around the pedestal's edge 186.

The pedestal assembly 160 moves vertically within the chamber cavity by a lift mechanism (not shown) between a first (top) position 501 and a second (bottom) position 502. This second position 502 of the pedestal assembly 160 is illustrated in phantom in FIG. 5a. During wafer processing, e.g., for film deposition onto the wafer substrate 564, the pedestal assembly 160 is placed in the first position 501. A reaction zone, or process zone 515, within the chamber cavity 280 can be defined roughly as the space between the bottom 332 of the faceplate 330 and the pedestal top surface 185, and confined on the side by the edge ring 290. A wafer substrate 564 is positioned in the wafer pocket 563 during wafer processing, and the distance between the wafer and the bottom of the faceplate 330 is approximately 0.360" (9.1 mm). Note that this distance is for illustrative purpose only, and it may be different for other process applications. The spacing 530 between the outside edge 186 of the pedestal 180 o the inside surface 286 of the liner 200 is about 0.125" (3.2 mm). The choice of this spacing 530 is determined both by the specified temperature of the liner 200 and the need to prevent purge gas from entering the process zone 515.

Before and after film deposition for each wafer, the pedestal assembly 160 is moved to a second position 502 for wafer loading or unloading. In this second position 502, the pedestal top surface 185 is slightly below a slit valve opening 260, which is located on the side, or cylindrical wall, 204 of the chamber liner 200 and the cylindrical side 254 of the chamber body 250. A wafer can be transported in and out of the process chamber 100 through the slit valve opening 260 to an adjacent transfer chamber and/or load-lock chamber (not shown), or another chamber within a cluster tool. A cluster tool of a type that can be coupled to the process chamber 100 is described in a commonly assigned U.S. Pat. No. 5,186,718, entitled "Staged-Vacuum Wafer Processing System and Method", issued Feb. 16, 1993, and is herein incorporated by reference.

Wafer-handling and transport is accomplished by the wafer lift pins 285 in the pedestal 180 in conjunction with a robotic transfer assembly (not shown) which has been described in a commonly assigned U.S. Pat. No. 4,951,601, entitled "Multi-chamber Integrated Process System," issued Aug. 28, 1990; the complete disclosure of which is incorporated herein by reference. Briefly, the sequence for wafer loading involves the pedestal being placed in position 502, and a robotic arm transporting a wafer through the slit valve opening 260 into the process chamber 100. With the wafer 564 poised above the pedestal surface 185, the wafer lift ring 580 rises to engage pin bottoms such that the wafer lift pins 285 are raised above the pedestal top surface 185 to lift the wafer 564 off the robotic arm. After the retraction of the robotic arm away from the pedestal surface 185, the pedestal assembly 160 is raised to receive the wafer 564 in the wafer pocket 563, and the lift ring 580 lowers to its original position. The pedestal assembly 160 is subsequently moved into its first position 501 for wafer processing. The wafer unloading sequence is a reverse of the loading sequence. The self-adjusting mechanism for the vertical movement of the pedestal assembly 160 has also been described in a commonly assigned U.S. patent application Ser. No. 08/738,240, filed on Oct. 25, 1996, and entitled "Self-Aligning Lift Mechanism," the disclosure of which is herein incorporated by reference.

Improved Purge Arrangement

FIG. 5a also illustrates details of an edge ring 290 and a backside gas purge arrangement. The edge ring 290 is disposed around the outer perimeter 187 of the pedestal 180 of the pedestal assembly 160. This edge ring 290 is substantially annular, with a protruding portion 292 at the bottom 294 of the ring 290. As such, this protruding portion 292 essentially divides the bottom 294 of the ring 290 into an inside bottom surface 297 and an outside bottom surface 298. When the pedestal assembly 160 is in its first position 501, the edge ring 290 rests on top of the heated pedestal 180, such that its inside bottom surface 297 covers part of the top pedestal surface 185. Also, in this position, the protruded portion 292 of the edge ring 290 covers part of the side, or outside edge 186 of the pedestal 180. A space 531 is then defined between the outside bottom portion 298 of the edge ring 290 and a protruded portion 203 of the heated liner 200. This gap 531 provides a choke for the bottom, or backside, purge gas flow (to be described below) and ensures uniform distribution of the purge gas about the edge of the pedestal 180.

When the pedestal assembly 160 is in its second position 502, the edge ring 290 rests on top of the protruded portion 203 of the heated liner 200. As such, the edge ring does not interfere with access of the robotic transfer mechanism as it places and/or retrieves the wafer to/from the pedestal 180.

The edge ring 290 can be made of a variety of materials such as ceramic, quartz, aluminum and steel, among others. The exact choice of material depends, of course, on the specific process applications. For example, quartz can be used for TiN deposition using $TiCl_4+NH_3$ chemistry.

The purpose of this edge ring 290 is two-fold: 1) to act as a choke such that uniform pumping can be established for the gases and/or by-products during processing; and 2) to prevent process gases from entering behind the pedestal assembly 160, which may cause undesirable deposits in the lower portions of the chamber 100.

During wafer processing, the pedestal assembly 160 is in the first (top) position 501, such that the gap 520 between the top 295 of the edge ring 290 and the bottom 332 of the faceplate 330 is about 0.05" (1.3 mm). A backside purge is established by flowing argon through a liner purge inlet 505 into the gap 599 between the liner 200 and chamber body 250 to prevent powder deposition on the cold wall surfaces of the chamber body 250. This gap 599 is about 0.06" (1.5 mm) wide. To facilitate purge gas flow, a set of holes 595 is also provided through the shaft portion 590 of the wafer lift ring 580 located around the pedestal shaft 560 at the bottom opening 258. Undesirable deposition behind the pedestal 180 is prevented by establishing a purge gas flow through these holes 595 into the chamber cavity 280, as illustrated by the arrows. As previously mentioned, various spaces such as 520, 530, and 531 are defined by different portions of the showerhead 330, pedestal 180, edge ring 290, and liner 200. It is to be understood that dimensions quoted for these spaces, like those quoted for other components, are for illustrative purpose only. In general, the choice of these dimensions depend on the desired results of a specific process being performed in the chamber. For example, spaces 530 and 531 are selected to ensure uniformity in the purge gas distribution around the edge of the pedestal 180. The space 520 may be a variable parameter affecting uniformity or deposition rate in the film deposition step itself. Suffice to say that one skilled in the art of wafer processing would be able to arrive at optimal combinations of these dimensions to achieve desirable wafer processing results such as deposition uniformity.

Figure 5B:
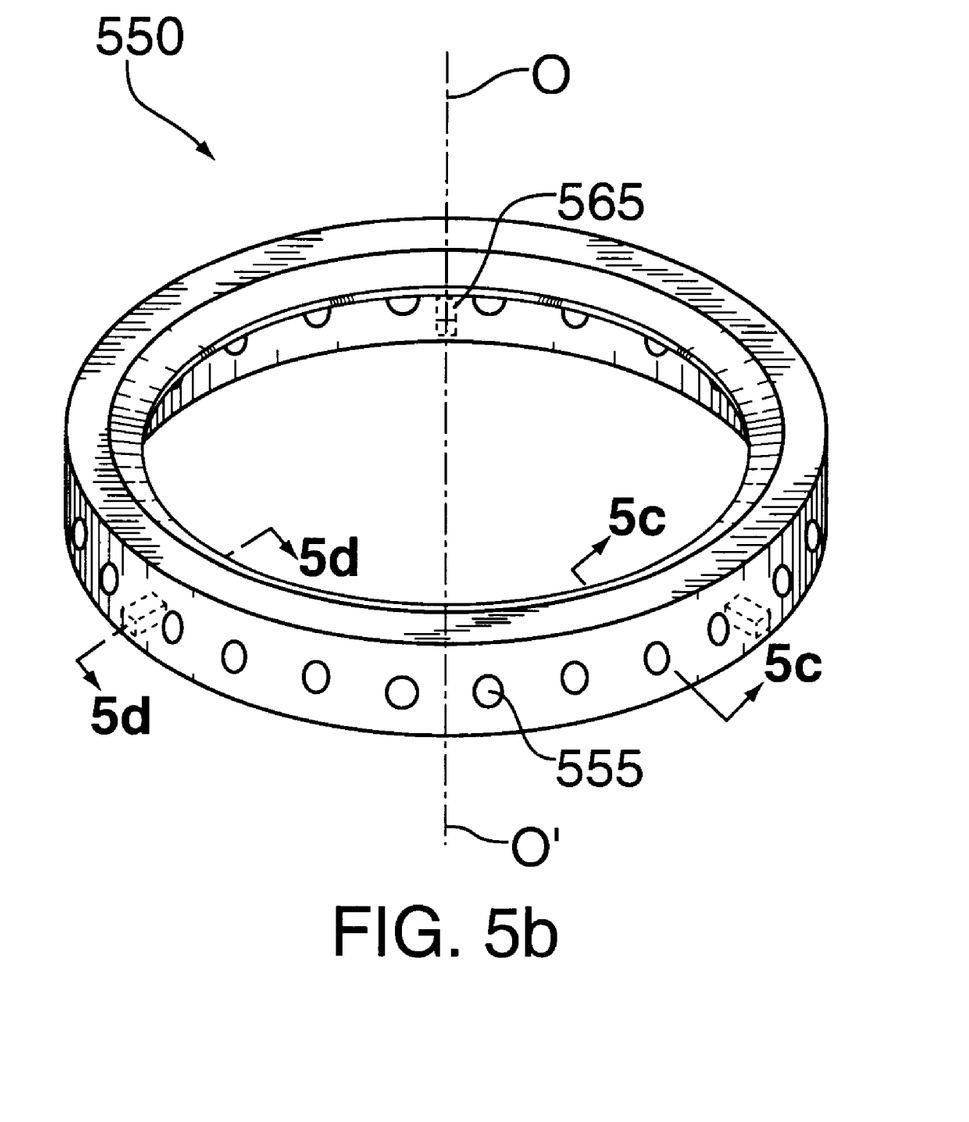
FIG. 5b is a perspective view of another embodiment of an edge ring.
Figure 5C:
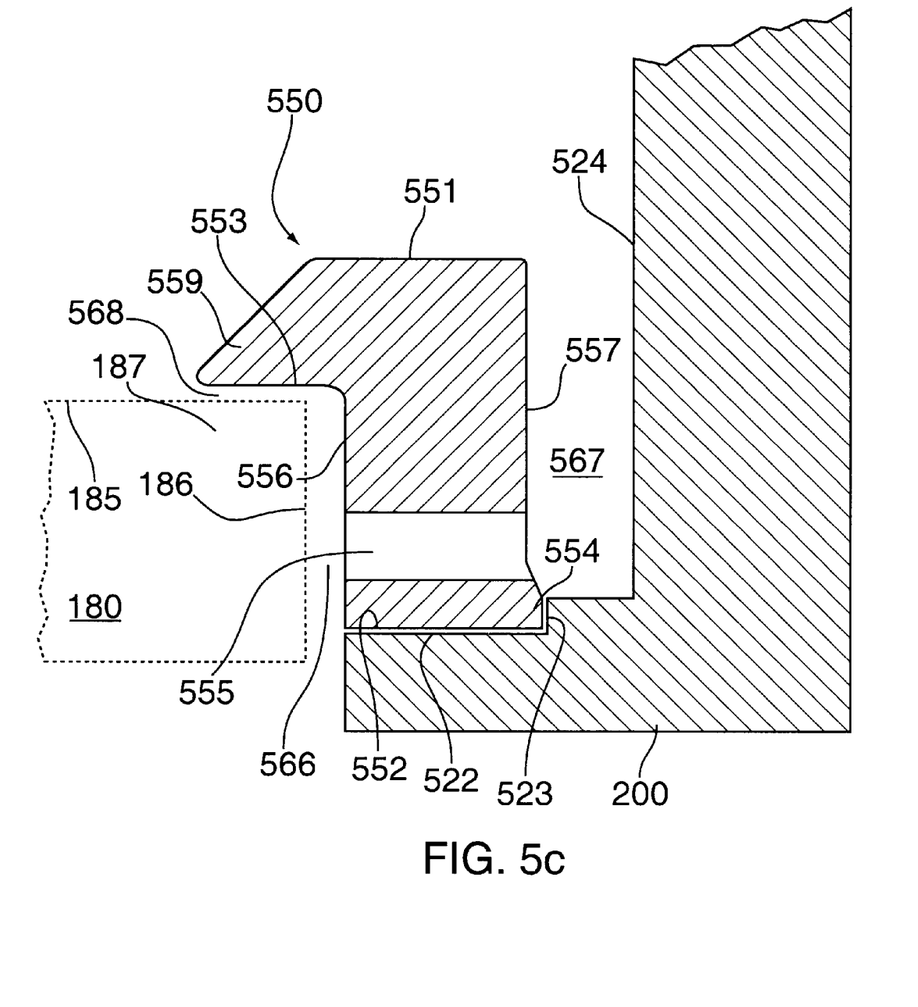
FIG. 5c is a partial cross-sectional view of the edge ring (line 5c in FIG. 5b) resting atop of the liner.
Figure 5D:
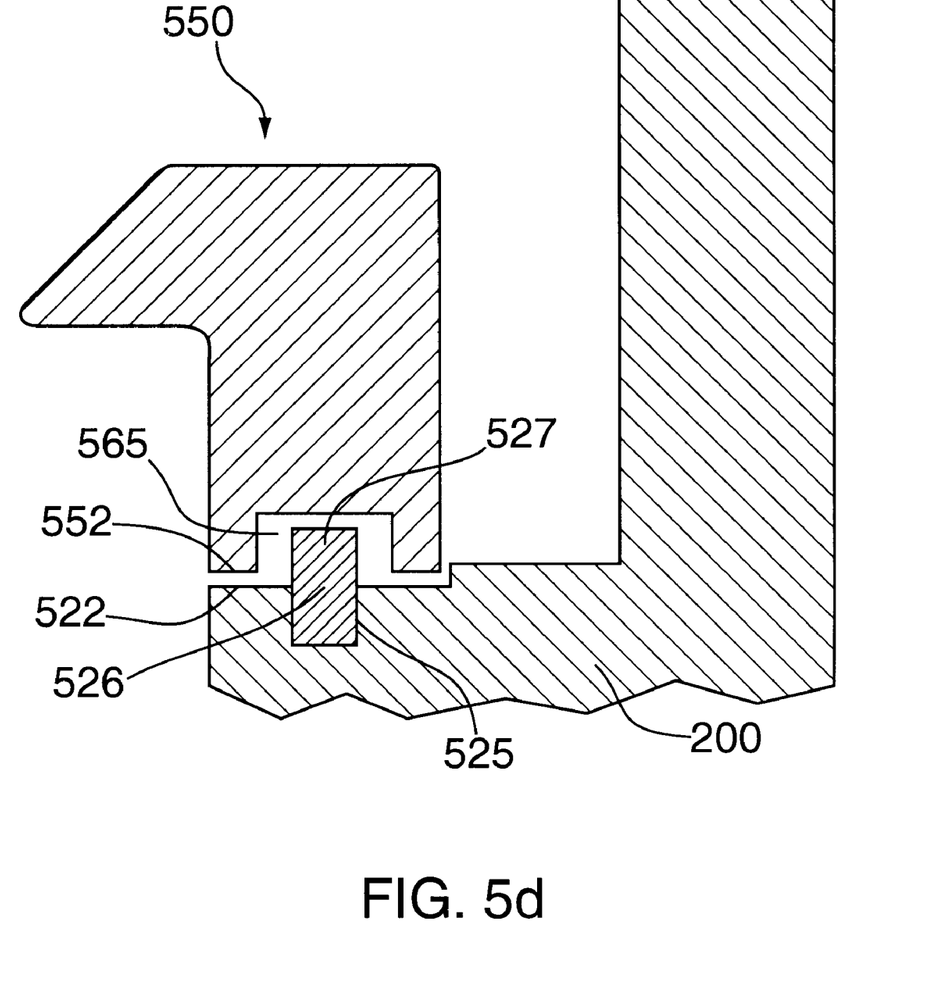
FIG. 5d is a partial cross-sectional view of the edge ring (line 5d in FIG. 5b) resting atop of the liner.

FIG. 5b shows a perspective view of an alternative embodiment of an edge ring 550, and FIGS. 5c and 5d show partial cross-sectional views of the edge ring 550 being supported by a horizontal surface 522 of the liner 200. FIG. 5c illustrates the edge ring 550 with a top surface 551, a bottom surface 552, an inside surface 556, an outside surface 557, and a protruded inside portion 559. In this embodiment, the edge ring 550 is supported entirely by the liner 200, i.e., the edge ring 550 does not contact the pedestal 180 or wafer 564. A step 523 is provided on a horizontal surface 522 of the liner 200 to keep the edge ring 550 in place. A key stop portion 554 located on the outside surface 557 of the edge ring 550 interfits with the step 523 of the liner 200 to facilitate secure mounting of the edge ring 550. Additionally, three grooves or slots 565 are provided on the bottom surface 552 of the edge ring 550 (see FIG. 5d), and are located equidistant from each other. Three pins 526 are press fit into corresponding recessed holes 525 in the horizontal surface 522 of the liner 200. A portion 527 of the pin 526 protrudes above the horizontal surface 522 of the liner 200 and engages the slot 565 at the bottom surface 552 of the edge ring 550. As such, the edge ring 550 is prevented from rotating with respect to the liner 200. Optionally, mounting screws (not shown) can also be used to secure the edge ring 550 to the liner 200. Again, the dimensions disclosed for the pin and slot arrangement are for illustrative purpose only, and do not represent limitations pertaining to the practice of this invention. Suffice to say that in the present arrangement, the edge ring 550 is heated by thermal radiation from the pedestal 180, and expands before the liner 200 reaches the same final temperature. This results in a uniform expansion of the edge ring 550 with respect to its centerline O–O'.

During wafer processing, when the pedestal 180 (shown in phantom in FIG. 5c) is in the first position 501, the protruded inside portion 559 of the edge ring 550 is disposed over the outer perimeter 187 of the pedestal 180, such that the outer perimeter 187 and the outside edge 186 of the pedestal 180 are in close proximity to and substantially surrounded by the edge ring 550. Thus, undesirable deposition over the perimeter 187 and outer edge 186 of the pedestal 180 can be avoided. In this embodiment, however, there is no direct physical contact between the pedestal 180 and the edge ring 550. Instead, a gap or space 568 is maintained between the top 185 of the pedestal 180 and the bottom 553 of the protruded portion 559 of the edge ring 550. Another space 566 is defined between the pedestal edge 186 and the inside surface 556 of the edge ring 550.

A number of openings 555, e.g., about 30 in this particular embodiment, are provided around the circumference of the edge ring 550 close to the bottom surface 552. These openings 555 extend horizontally from the inside surface 556 to the outside surface 557 of the edge ring 550. Through these openings 555, a purge gas is pumped from the space 566, into the space 567 between the outside surface 557 of the edge ring 550 and the inside surface 524 of the liner 200. The gap 568 acts as a choke to prevent any purge gas from flowing towards the top 185 of the pedestal 180, which may otherwise dilute the process gases and affect the deposition process. Similar to the other edge ring 290 shown in FIG. 5a, the top surface 551 of this edge ring 550 and the bottom 332 of the showerhead 330 defines the space 520 through which process gases and/or by-products are pumped out from the reaction zone 515 (see FIG. 5a). The dimensions of these spaces 520, 566, 567 and 568 are process-dependent, and are typically designed to suit the needs of a particular process. For example, one skilled in the art would seek to adjust these spacings to optimize or achieve desired results such as deposition uniformity. Furthermore, this particular configuration (the liner 200 supporting the edge ring 550) allows the temperature of the edge ring 550 to be maintained within a range of approximately 200–250° C., and undesirable deposition on the edge ring 550 is further minimized. Note that the use of an edge ring, while highly desirable, is not absolutely necessary for the practice of this invention.

Returning to FIG. 5a, during wafer deposition, $TiCl_4$ in a He carrier gas and $NH_3$ in a $H_2$ carrier gas are introduced into the processing zone 515 via the showerhead assembly 300 and a chemical reaction between $TiCl_4$ and $NH_3$ takes place at close proximity above the wafer 564 that is supported by the heated pedestal 180. The reaction results in the deposition of TiN film onto the wafer 564. A continuous gas flow is maintained by the pumping system that is attached to the exhaust assembly 600 such that gases, including any volatile reaction products, are pumped out of the processing zone 515 and other areas of the chamber cavity 280, past the space 520 between the top 295 of the quartz edge ring 290 and the bottom 332 of the faceplate 330, through a slot 205 (see FIG. 2a) in the inside liner 200, into the exhaust chamber 600 which is connected to the process chamber 100 by various vacuum adapter and connector components. While the exhaust assembly 600 removes gases, the showerhead 330 replaces the process gases and the purge gas is continuously flowed past the outer edge 186 of the pedestal 180. This ensures a steady fresh supply of process and purge gases within the chamber 100 during wafer processing.

Heated Exhaust Assembly

Figure 6:
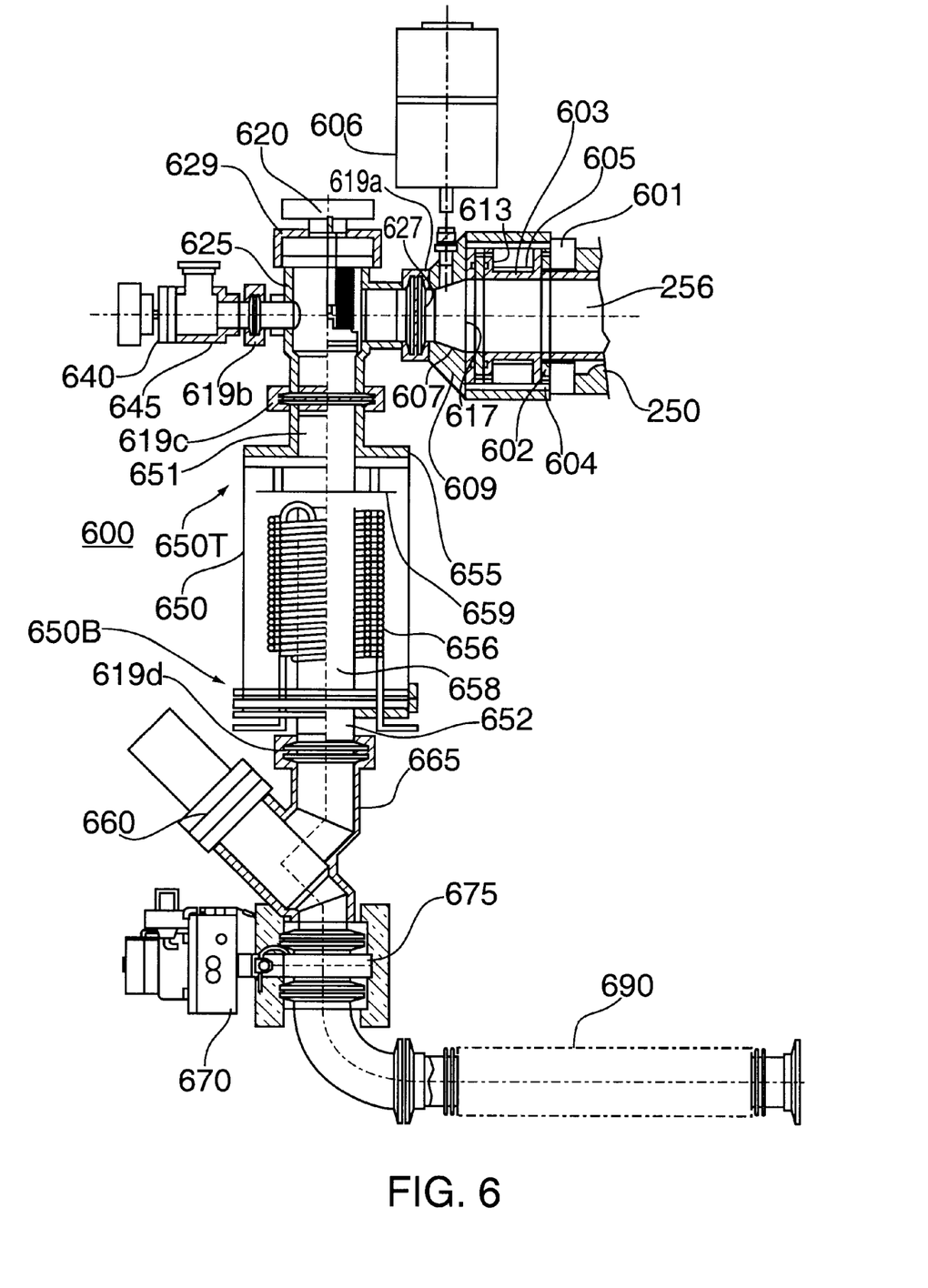
FIG. 6 shows a partial cross-sectional view of the exhaust assembly.

FIG. 6 shows a cross-sectional view of one embodiment of the exhaust assembly 600 and vacuum components connecting it to the process chamber 100. These vacuum components comprise: an adapter plate 601, a thermal insulator 602, an exhaust tubing 603, a band heater 605, a cover 604, a 20-torr Baratron 606, and a reducer 607. The annular adapter plate 601 mates directly to the chamber body 250 around the side opening 256, and fits around the outside of an exhaust tubing 603 which extends partly into the process chamber 100 side opening 256. A thermal insulator 602 is fitted adjacent to the adapter 601 on the side away from the process chamber 100. This thermal insulator 602 provides insulation between the heated exhaust assembly 600, which is maintained at a temperature of about 150° C., and the chamber body 250, which is maintained at a temperature of about 60–65° C. A band heater 605 is located around a substantial portion of the outside wall of the exhaust tubing 603. An annular cover 604 fits over the outside of the insulator 602, the band heater 605 and the remaining exhaust tubing portion 603. At the far end 613 of the exhaust tubing (away from the process chamber 100) is a reducer 607, which has a larger diameter opening 617 on one end to mate with the exhaust tubing 603, and a smaller diameter opening 627 at the other end to mate to additional components of the exhaust assembly 600. A 20-torr Baratron pressure gauge 606 is connected to the reducer 607 via a side port. Numerous heaters are installed to maintain the exhaust assembly 600 at a temperature of approximately 150–200° C. so as reduce undesirable deposits from coating the interior walls of the exhaust assembly 600 and the associated vacuum components. For example, a series of flexible heaters 625, 645, 655, 665 and 675, are installed around the outside walls of the exhaust assembly 600, a 2" manual angle valve 620, a 1" manual valve 640, cold trap 650, isolation valve 660, and throttle valve 670. Note that heating is necessary even for the isolation valve 660 and the throttle valve 670 which are located beyond the cold trap 650 in order to prevent the formation of undesirable deposit inside these vacuum components. Additionally, to minimize heat loss and to provide a safe operating environment, heater jackets 609, 629, 619a, 619b, 619c and 619d are provided around the reducer 607, the 2" manual angle valve 620 and various parts of the exhaust assembly 600.

The cold trap 650 is connected between the manual valve 620 and the isolation valve 660. A heater 655 is provided around the inlet 651 of the cold trap 650 to keep the temperature in the range of 150–200° C. This prevents undesirable deposits from forming on the interior of the inlet 651 of the cold trap 650. A baffle plate 659 is provided close to the top 650T of the cold trap 650. A multi-loop cooling coil 656 is brazed to the bottom 650B of the cold trap 650, and cooling water at a temperature of about 20–25° C. is circulated inside the cooling coil 656. When the exhaust gases enter the cold trap 650 through the inlet 651, they are diverted by the baffle plate 659 to flow radially outwards. Some of the condensibles, such as HCl and other by-products from the $TiCl_4/NH_3$ reaction, are trapped onto the baffle plate 659, but most are trapped onto the cooling coil 656, which offers a relatively large trapping surface area. The remaining exhaust gases exit the cold trap 650 through an axially located channel 658 which is connected to the outlet 652 of the cold trap 650, and pass through the isolation valve 660 and the throttle valve 670 before being exhausted into the exhaust line 690.

Although a chlorine-based chamber cleaning process (to be described below) provides efficient dry cleaning of the interior of the exhaust assembly 600, powder deposits tend to accumulate after an extended period of wafer processing—e.g., 5000 wafers. These deposits can readily be removed by cleaning with water or hydrogen peroxide during periodic maintenance. The use of the heated exhaust assembly 600 contributes to equipment uptime by facilitating chamber maintenance and extending the time between chamber cleanings.

Chamber Cleaning Process

As with most processing equipment, periodic chamber cleaning is necessary to ensure cleanliness of the processed wafers. An in-situ chlorine-based thermal cleaning process has been developed for this purpose. When TiN deposition is accomplished using $TiCl_4$ and $NH_3$, a TiN film deposit is formed on the chamber interior (as opposed to a powder deposit of adduct ammonia salt), as long as the wall temperature is kept at around 150–250° C. This film can be effectively removed (etched) by the use of an in-situ thermal chlorine process. This thermal cleaning process is described in a commonly assigned U.S. patent application Ser. No. 09/163,711, filed on Sep. 30, 1998 by Vasudev et al., and is hereby incorporated by reference. Chlorine gas is introduced into the chamber 100 via the same flow path as for $TiCl_4$ inside the showerhead assembly 300. Typical process conditions include a chlorine flow rate in the range of 500 sccm, a pressure in the range of 10–20 torr, and a temperature range of 600–700° C. for the heater 180, and 150–250° C. for the interior walls of chamber 100. Of course, the process parameters may be adjusted to suit specific needs, depending on the actual cleaning process conditions employed. In addition to thermal cleaning, it is anticipated that the chamber 100 can also be adapted for use with other cleaning techniques such a plasma-based or remote microwave chlorine processes. For example, adaptation for plasma-based cleaning processes would require a modification of the chamber lid 310 to accommodate RF biasing, as well as to allow for electrical isolation from ground. To ignite a cleaning plasma, RF power would be applied between the showerhead assembly 300 and the chamber body 250 and liner 200 (ground). The hardware modifications necessary to implement plasma cleaning are described below in the section on plasma generation.

Post-Deposition Anneal

After TiN film deposition, an annealing step can be used to improve the film properties. Film annealing is performed by thermal annealing the wafer at a relatively high temperature, e.g., 750° C., which is readily attainable using the existing heated pedestal 180. Annealing reduces traces of chlorine in the TiN film, which may otherwise result in undesirably high film resistivity. Alternatively, plasma annealing may also be used, in which case, the showerhead 330 acts as a top RF electrode while the pedestal 180 serves as a bottom ground electrode. The hardware modifications necessary for plasma annealing are described below.

Plasma Generation

Figure 7A:
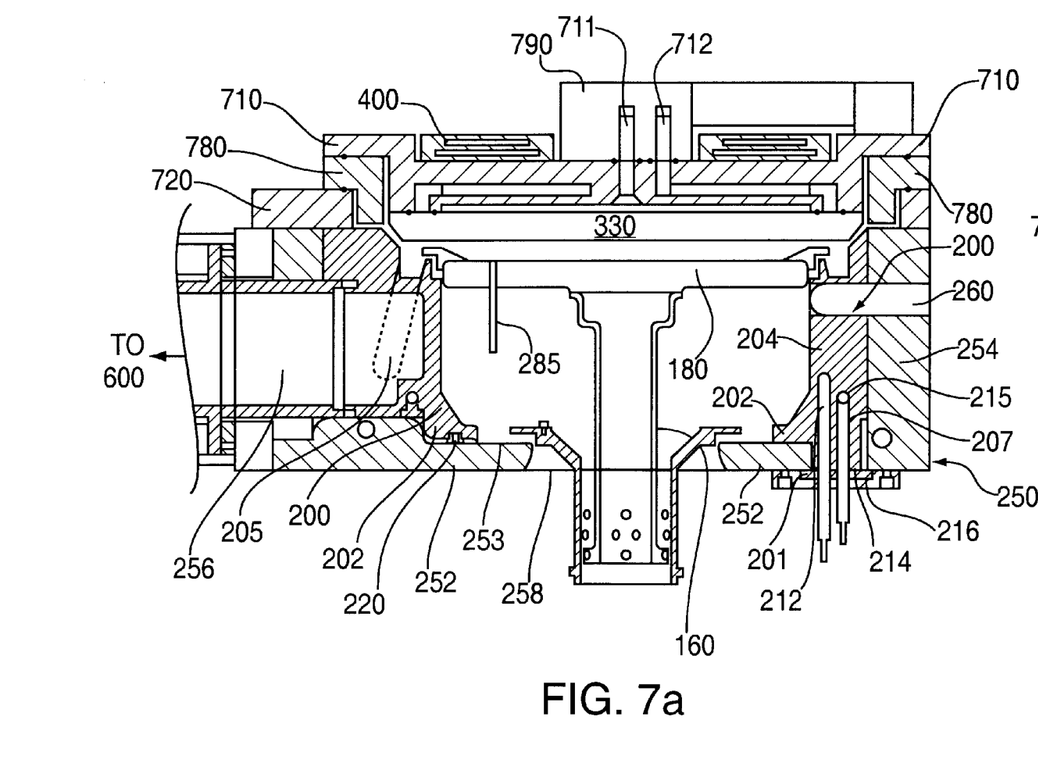
FIG. 7a shows a conceptual design of a process chamber modified for plasma application.
Figure 7B:
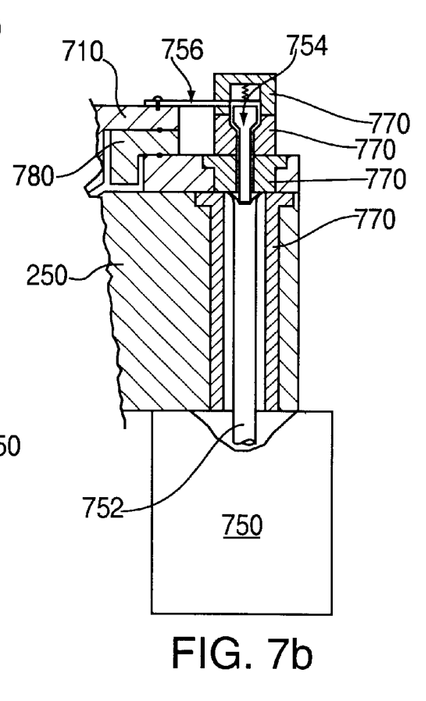

Although the existing chamber 100 described above is suitable only for non-plasma application, the chamber can readily be modified for plasma-enhanced applications such as deposition, cleaning or annealing. For thermal deposition process, the entire lid assembly (i.e., cooling plate assembly 400, lid/gas box 310 and showerhead 330) is coupled to the grounded chamber body 250 and liner 200. In plasma applications, however, RF power is applied to the showerhead 330. Electrical isolation is therefore required between the showerhead 330 and the chamber body 250. FIG. 7a illustrates one embodiment of a modified configuration for plasma application. For example, the RF lids used for existing CVD chambers, such as CVD Ti, W, Al and dielectric chamber lids (configured for plasma application) are suitable for adaptation to the high temperature CVD chamber of the present invention. As shown in FIG. 7a, both the showerhead 330 and the gas box 710 are electrically insulated from the chamber lid 720 by a ceramic isolator 780. The chamber lid 720 and the chamber body 250 remain at ground. FIG. 7b shows an RF module 750, which supplies RF power to the showerhead 330. The RF module 750 can either be chamber installed or remotely installed, and provides RF power to the showerhead 330 through a RF connecting rod 752, a RF plunger connector 754 and a RF strap connector 756. Several delrin insulators 770 insulate these RF connectors 752, 754 and 756 from the chamber body 250 and the chamber lid 720. During deposition, process gases enter the process chamber 100 via separate gas inlets 711 and 712 of the gas box 710, which is connected to the dual-gas showerhead 330. To prevent electrical breakdown of process gases inside the gas delivery lines, a voltage gradient assembly 790 is installed over the gas box 710 around the gas inlets 711 and 712. Detailed description of this voltage gradient assembly 790 is provided in a commonly-assigned U.S. Pat. No. 5,362,526 entitled "Plasma-Enhanced CVD Process Using TEOS for Depositing Silicon Oxide", filed on Jan. 23, 1991. This patent is herein incorporated by reference.

It should be emphasized that there is no inherent limitation restricting the use of this high temperature chamber to TiN film deposition. In general, other CVD film deposition can also be performed using this high temperature chamber. Furthermore, it is possible to extend the use of this chamber to facilitate other process applications. The dual-gas showerhead arrangement will be useful in any application where there is a need to separately introduce processing gases without premixing, and the heated liner may also find applications in various etch and deposition processes where deposition of by-products of the process are reduced by heating chamber surfaces.

Although a preferred embodiment which incorporates the teachings of the present invention has been shown and described in detail, those skilled in the art can readily devise many other varied embodiments that still incorporate these teachings.

What is claimed is:

1. Apparatus for wafer processing, comprising:

a chamber body;

a liner enclosed within said chamber body and thermally isolated therefrom by a plurality of pins, where said liner is maintained at a first temperature T1, and said chamber body is maintained at a second temperature T2, where said second temperature T2 is lower than said first temperature T1;

an exhaust assembly connected to said chamber body; and at least one heater element positioned proximate to the exhaust assembly to maintain said exhaust assembly at a temperature T4.

2. The apparatus as in claim 1, wherein said pins are made of stainless steel or nickel.

3. The apparatus as in claim 1, wherein said wafer processing comprises depositing titanium nitride film from a reaction of titanium tetrachloride and ammonia.

4. The apparatus as in claim 1, wherein said first temperature T1 is approximately between 150° C. and 250° C.; and said second temperature T2 is approximately between 60° C. and 65° C.

5. The apparatus as in claim 1, wherein said liner further comprises a heater embedded therein.

6. The apparatus as in claim 1, further comprising:

a pedestal positioned centrally within said liner to support a substrate within the chamber, where said pedestal is maintained at a third temperature T3 approximately between 600° C. and 800° C.

7. The apparatus as in claim 6, wherein said pedestal further comprises a heating element disposed inside said pedestal.

8. The apparatus as in claim 6, wherein said pedestal is made of a ceramic material.

9. The apparatus as in claim 8, wherein said ceramic material is aluminum nitride.

10. Air The apparatus as in claim 6, wherein said pedestal further comprises an electrode disposed inside said pedestal, and said electrode is capable of imparting radio frequency power to a volume proximate said pedestal.

11. The apparatus as in claim 1, wherein said temperature T4 is approximately between 150° C. and 200° C.

12. The apparatus as in claim 1, further comprising:

a pedestal having a top surface, a bottom surface, an outer perimeter and an outside edge;

a substantially annular edge ring having a top surface, a bottom surface, an inside surface, an outside surface, and a protruded portion; and said bottom surface, said inside surface and said protruded portion of said edge ring are disposed adjacent to and in close proximity to said outer perimeter and outside edge of said pedestal.

13. Apparatus for wafer processing, comprising:

a substantially bucket-shaped chamber body having a chamber side and a substantially annular-shaped chamber base having an inside bottom surface and defining a bottom opening in said chamber body, said chamber body capable of being maintained at a temperature T2;

a liner enclosed within said chamber body, the liner having a top end and a bottom end, an inside surface and an outside surface, where said liner is maintained at a temperature T1 which is higher than said temperature T2 of said chamber body;

a plurality of pins disposed between said bottom end of said liner and said inside surface of said chamber base that maintains said liner and said chamber base in a spaced apart relation;

a pedestal assembly positioned centrally within said bottom opening of said chamber body and within said liner, said pedestal assembly comprising:

a pedestal with a top surface, a bottom surface and a circumferential edge having a heater and at least one electrode embedded therein, said pedestal capable of being maintained at a temperature T3 which is higher than temperatures T1 and T2;

a shaft-like portion connected to said bottom surface of said pedestal;

a showerhead disposed above said pedestal having a top surface and a bottom surface;

an edge ring disposed at said circumferential edge of said pedestal; and an exhaust assembly connected to said chamber body having an interior surface and an exterior surface, with at least one heater element positioned proximate to the exhaust assembly to maintain said exhaust assembly at a temperature T4.

14. The apparatus as in claim 13, where said liner has a heater embedded therein.

15. The apparatus as in claim 13, wherein said temperature T1 is approximately between 150° C. and 250° C.; said temperature T2 is approximately between 60° C. and 65° C.; said temperature T3 is approximately between 600° C. and 800° C.; and said temperature T4 is approximately between 150° C. and 200° C.

16. The apparatus as in claim 13, wherein said showerhead is capable of being coupled to a radio-frequency source for imparting radio-frequency to said showerhead.

* * * * *